June 12, 1962 S. T. DEAKIN 3,038,703

ELECTRONIC EQUIPMENT

Original Filed Nov. 12, 1957

INVENTOR

STANLEY THOMAS DEAKIN

Morris & Bateman

ATTORNEYS

United States Patent Office 3,038,703

Patented June 12, 1962

3,038,703
ELECTRONIC EQUIPMENT

Stanley Thomas Deakin, Ewell West, England, assignor to Siemens Edison Swan Limited, London England, a British company Original application Nov. 12, 1957, Ser. No. 695,647, now Patent No. 2,917,286, dated Dec. 15, 1959. Divided and this application Apr. 8, 1959, Ser. No. 805,064
Claims priority, application Great Britain Nov. 13, 1956
2 Claims. (Cl. 257—263)

The present invention relates to electronic equipment, and more particularly to electronic equipment of the kind employing semi-conductor devices such as rectifiers and transistors.

This is a division of my application Serial No. 695,647 filed November 12, 1957 and since issued as U.S. Letters Patent No. 2,917,286.

Such devices generate heat and it is necessary to dissipate this heat. Such heat dissipation is of special importance in the case of permanent semi-conductors in which the maximum temperature at which the device will operate is strictly limited.

The object of the present invention is to provide electronic equipment employing semi-conductor devices which includes improved means for dissipating heat generated in said semi-conductor devices.

According to the present invention electronic equipment comprises a chassis member, at least a metallic surface to said chassis member, and a resilient holder for a semi-conductor device mounted in good thermal contact with said chassis member and adapted to hold a semi-conductor device in such a manner as to provide a good thermally conducting path from said semi-conductor device to said chassis member.

Preferably the holder comprises a resilient cup-shaped socket portion in good thermal contact with one surface of said chassis and adapted to receive said semi-conductor device, resilient arms extending from opposite sides of said socket portion and passing through co-operating apertures in said chassis member, and hook portions at the ends of said arms adapted to abut against the opposite surface of said chassis member so as to resist withdrawal of said arms from said apertures.

Figure 1:
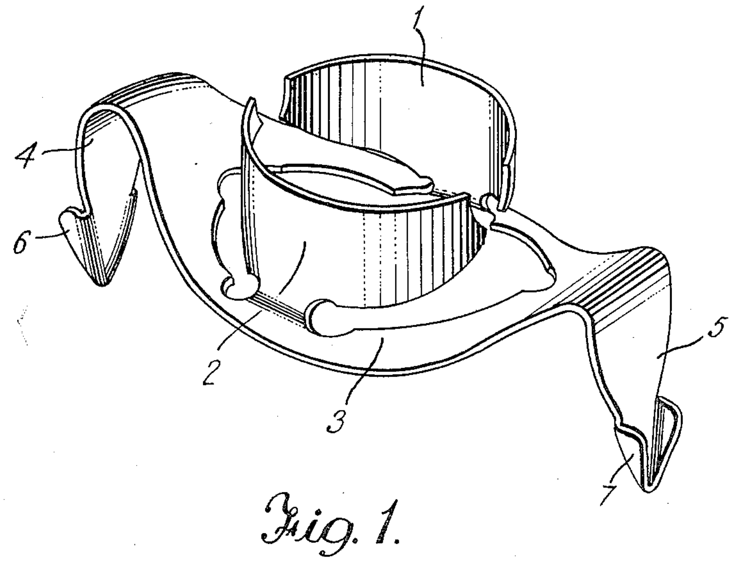
Figure 2:
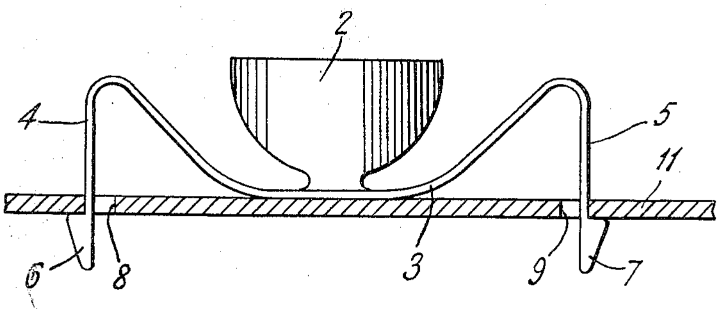

In order that the invention may be more readily understood reference will now be made to the accompanying drawing, in which:

FIG. 1 illustrates a holder for a semi-conductor device which can be used in an embodiment of the invention, and FIG. 2 is a side view of the holder illustrated in FIG. 1 in position in the chassis member of electronic equipment.

With reference to FIGS. 1 and 2 the holder, which is formed from a strip of sheet metal comprises a cylindrical socket portion formed from two suitably shaped side pieces, 1, 2, separated laterally and each attached at one end to a base plate 3. The socket portion forms a socket for a semi-conductor device such as a transistor, and the side pieces are resilient so that the semi-conductor device is retained rigidly within the socket.

A base plate 3 is formed with two arms 4, 5 which are bent at right angles to the plane of the plate and terminate in hooks 6, 7. As illustrated in FIG. 2 the arms 4, 5 are adapted to pass through co-operating apertures 8, 9 in a chassis member 11 of the electronic equipment, so that the hooks 6, 7 abut against one surface of the chassis member and the base plate 3 abuts against the other surface of the chassis member. Since the base plate is resilient the holder is secured firmly to the chassis member and is in good thermal contact therewith.

There is a good heat conducting path to the chassis member. Hence heat will be conducted from the semi-conductor device contained in the holder to the chassis member. The chassis member 11 is preferably made of metal or is metal coated so as to provide a good heat path. The chassis member may be water cooled.

The holder described may be used in dip soldering processes, in which case the metal chassis member will be replaced by an insulating board, as is used in printed circuit construction.

The semi-conductor device may be inserted in the holder from the side remote from the chassis member, or from the other side through a suitably placed aperture in the chassis member.

A number of holders of the type described above can be attached to a suitable chassis member to hold semi-conductor devices, together with other components so as to constitute an electronic circuit. The holders provide good heat conducting paths from the heat generating semi-conductor devices to the chassis member and therefore prevent the semi-conductor devices from overheating.

There is described above an improved holder for a heat generating semi-conductor device which can be used to prevent heat generating components in electronic equipment from overheating and thereby damaging themselves.

What I claim is:

1. Electronic equipment including a chassis member having a metallic surface of substantial area and formed with apertures adjacent said surface, a unitary sheet metal holder for a semi-conductor device mounted on said chassis member and having a base disposed with a substantial surface area in good thermal contact with said metallic surface area of said chassis member, resilient side members projecting angularly from one side of said base and coacting for forming a socket portion on said holder adapted to receive said semi-conductor device, at least two resilient arms on said holder extending from opposite sides of said socket portion and passing through co-operating apertures in said chassis member, each of said arms extending angularly from said one side of said base in relative diverging relationship and then turning reversely to provide substantially parallel portions extending through said apertures past said base, and hook portions at the ends of said arms disposed at the other side of said chassis member adapted to abut against the surface of said chassis member opposite from that engaged by said base so as to resist withdrawal of said arms from said apertures, said resilient arms being thereby held deformed from their natural shape so that said holder base is forced into firm contact with said metallic surface.

2. Electronic equipment including a chassis member having a metallic surface of substantial area and formed with apertures adjacent said surface, and a sheet metal holder for a semiconductor device mounted on said chassis member, said sheet metal holder comprising a base portion with a substantial part of one side thereof in contact with said metallic surface area and two resilient side members extending outwardly from the side of said base portion opposite said one side in transverse relationship to said base portion, said two resilient side members being so shaped as to form a socket portion for said semi-conductor device, said holder having two resilient arms extending from opposite sides of said socket portion with each of said resilient arms being formed with a first portion and a second portion, said first portion extending from said base portion in a direction away from said chassis member at an acute angle to said chassis member, said second portion being disposed at an acute angle to said first portion and extending from said portion toward said chassis member and passing through said apertures in said chassis member adjacent said metallic surface and said second arm portions being substantially parallel to each other, and a hook on said second portion adapted to abut against a second surface on said chassis member opposite that contacted by said base portion so as to resist withdrawal of said arm from said aperture, each resilient arm being thereby held deformed so that said substantial portion of the surface of said base is forced into firm contact with said metallic surface area and provides a good thermally conducting path between said holder and said chassis member.

References Cited in the file of this patent

UNITED STATES PATENTS

| | | |
|---|---|---|
| 2,601,027 | Keim | June 17, 1952 |
| 2,627,385 | Tinnerman | Feb. 3, 1953 |
| 2,798,271 | Flora | July 9, 1957 |
| 2,911,575 | Roberts | Nov. 3, 1959 |